US007443226B1

(12) United States Patent
Holloway et al.

(10) Patent No.: US 7,443,226 B1
(45) Date of Patent: Oct. 28, 2008

(54) EMITTER AREA TRIM SCHEME FOR A PTAT CURRENT SOURCE

(75) Inventors: Peter R. Holloway, Groveland, MA (US); Jun Wan, Wilmington, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/766,657

(22) Filed: Jun. 21, 2007

Related U.S. Application Data

(62) Division of application No. 11/284,583, filed on Nov. 22, 2005, now Pat. No. 7,236,048.

(51) Int. Cl.
*H01L 35/00* (2006.01)

(52) U.S. Cl. ...................................................... 327/513

(58) Field of Classification Search ................. 327/512, 327/513, 537, 538, 539, 543
See application file for complete search history.

(56) References Cited

U.S. PATENT DOCUMENTS

| | | | |
|---|---|---|---|
| 4,350,904 A | 9/1982 | Cordell | |
| 5,543,746 A | 8/1996 | Kuo | |
| 5,604,467 A | 2/1997 | Matthews | |
| 6,737,908 B2 | 5/2004 | Mottola et al. | |
| 6,844,772 B2 | 1/2005 | Hoon et al. | |
| 7,071,767 B2 * | 7/2006 | Ou-yang et al. | 327/539 |
| 7,215,183 B2 * | 5/2007 | Nakada | 327/539 |

* cited by examiner

*Primary Examiner*—Jeffrey S Zweizig
(74) *Attorney, Agent, or Firm*—Patent Law Group LLP; Carmen C. Cook

(57) ABSTRACT

A current source for generating a PTAT current using two bipolar transistors with an 1:A emitter area ratio implements a split resistor architecture to cancel mismatch errors in the current mirror of the current source. In one embodiment, a first resistor is coupled to the unit area bipolar transistor and a second resistor is coupled to the A-ratio-area bipolar transistor. The first resistor has a resistance value indicative of the emitter resistance $r_e$ of the bipolar transistors while the second resistor has a resistance value satisfying the equation $r_e$* (lnA−1). In another embodiment, an emitter area trim scheme is applied in a PTAT current source to cancel, in one trim operation, both bipolar transistor area mismatch error and sheet resistance variations. The emitter area trim scheme operates to modify the emitter area of the A-ratio-area bipolar transistor to select the best effective emitter area that provides the most accurate PTAT current.

8 Claims, 7 Drawing Sheets

EMITTER AREA TRIM SCHEME FOR A PTAT CURRENT SOURCE

CROSS-REFERENCE TO RELATED APPLICATION

This application is a divisional of application Ser. No. 11/284,583, filed Nov. 22, 2005, now U.S. Pat. No. 7,236,048, issued Jun. 26, 2007, entitled "Self-Regulating Process-Error Trimmable PTAT Current Source," of the same inventors hereof, which application is incorporated herein by reference in its entirety.

FIELD OF THE INVENTION

The invention relates to a current source for generating a current proportional to absolute temperature (PTAT) and, in particular, to a self-regulating PTAT current source that is process-error trimmable.

DESCRIPTION OF THE RELATED ART

A current proportional to absolute temperature (PTAT) or a PTAT current is a current with a known, fixed, positive temperature coefficient. PTAT currents are commonly used to bias transistors, amplifiers and other circuits when a PTAT current is desirable for compensating for performance variations due to temperature. Current sources for generating PTAT currents are known. FIG. 1 is a circuit diagram illustrating a conventional PTAT current source.

Referring to FIG. 1, current source 10 utilizes bipolar transistors Q2 and Q3 operating at unequal current densities to generate a voltage difference between the base-to-emitter voltages $V_{BE}$ of the two bipolar transistors. The difference in the base-to-emitter voltages, denoted as $\Delta V_{BE}$, is intrinsically PTAT in nature. Specifically, bipolar transistor Q3 is a unit size transistor while bipolar transistor Q2 has a size A times transistor Q3. A base-to-emitter voltage $V_{BEH}$ is generated at the base/collector terminal of transistor Q3 (node 16) while a base-to-emitter voltage $V_{BEL}$ is generated at the base/collector terminal of transistor Q2 (node 13).

The PTAT voltage $\Delta V_{BE}$, which is given as $\Delta V_{BE}=V_{BEH}-V_{BEL}$, is super-imposed across a resistor R0 to produce a current that is also PTAT (denoted as $I_{PTAT}$) when resistor R0 has a negligible TC (Temperature Coefficient). When resistor R0 has a constant TC, the resulting current will have a temperature coefficient having a proportionally factor somewhat less than (i.e. sub-PTAT) or greater than (i.e. super-PTAT) 100% relative to absolute temperature. Specifically, a current mirror, formed by PMOS transistors M2 and M3 and controlled by a gate voltage Vgate, is coupled to supply currents to bipolar transistors Q3 and Q2, respectively. An operational amplifier (op-amp) 12 is coupled to the bipolar transistors to provide feedback control. Voltage $V_{BEH}$ (on node 16) is coupled to the inverting input terminal as the input voltage Vin_n of the op-amp 12. Resistor R0 is coupled between the drain terminal of transistor M3 (node 14) and voltage $V_{BEL}$ (on node 13). The voltage at node 14, which is the top terminal of resistor R0, is coupled to the non-inverting input terminal of op-amp 12 as the input voltage Vin_p.

In operation, operational amplifier 12 generates an output voltage $V_{OUT}$ (node 18) that is coupled to drive a PMOS transistor M4 and fed back as the gate voltage Vgate to drive the current mirror of transistors M2 and M3. Op-amp 12 generates output voltage $V_{OUT}$ to cause the voltage difference between voltages Vin_p and Vin_n to go to zero. In this manner, the voltage at the top terminal (node 14) of resistor R0 is driven to voltage $V_{BEH}$ and voltage $\Delta V_{BE}$ is thus superimposed on resistor R0.

In the present illustration, operational amplifier 12 generates a voltage signal $V_{OUT}$ as the output signal and the voltage output signal is converted into a current value through PMOS transistor M4. Thus, output voltage $V_{OUT}$ is coupled to the gate and drain terminals of PMOS transistor M4 to generate a reference current $I_{REF}$ which is absorbed by operation amplifier 12. It is assumed that operational amplifier 12 is a low output impedance amplifier. Because the output voltage $V_{OUT}$ driving the gate terminal of transistor M4 is also coupled to drive the gate terminals of transistors M2 and M3, transistors M2, M3 and M4, being nominally equal in area, have the same gate-to-source voltages and thus these transistors provide the same drain current output. Therefore, the reference current $I_{REF}$ is equal to the PTAT current $I_{PTAT}$ generated at the drain terminal (node 14) of transistor M3. The ratio between reference current $I_{REF}$ and PTAT current $I_{PTAT}$ remains fixed over process and power supply voltage variations.

The equation which gives the relationship between resistor R0, the reference current $I_{REF}$, and the chosen area ratio A of the two NPN bipolar transistors Q2 and Q3 is:

$$I_{REF} = \frac{N_f KT \ln A}{qR_0}, \qquad \text{Eq. (1)}$$

where q is the electron charge; K is the Boltzmann's constant; T is absolute temperature; $N_f$ is emission coefficient; A is the area ratio of transistors Q2 to Q3 (A:1).

The conventional PTAT current source 10 of FIG. 1 has many shortcomings. In particular, the current mirror of the current source is sensitive to device mismatches and fabrications process variations, leading to poor power supply rejection and thus poor PTAT current accuracy.

In particular, one property of current source 10 that affects the accuracy of the PTAT current generated by the current source is the emitter resistance from the input terminals (nodes 14, 16) of operational amplifier looking into bipolar transistors Q2 and Q3. For a given bias condition, the emitter resistance $r_e$ is defined as follows:

$$r_e = \frac{N_f KT}{qI_{REF}}, \qquad \text{Eq. (2)}$$

where reference current $I_{REF}$ has the same current value as PTAT current $I_{PTAT}$. More specifically, the emitter resistance $r_e$ is a function of temperature T and the collector current $I_C$ of the bipolar transistor. In the present illustration, the collector current $I_C$ has the same current value as the reference current $I_{REF}$, i.e. $I_C=I_{REF}$. Thus, the emitter resistance $r_e$ as given in equation (2) is a function of temperature T and the reference current $I_{REF}$. By combining equations (1) and (2), the resistance of resistor R0 can be expressed as:

$$R_0 = \frac{N_f KT \ln A}{qI_{REF}} = \frac{N_f KT}{qI_{REF}} * \ln A = r_e * \ln A. \qquad \text{Eq. (3)}$$

Thus, the impedance seen at the unit area transistor Q3 has a value of $r_e$ while the impedance seen at the A-ratio-area transistor Q2 has a value of $r_e$*[1+lnA]. The fact that the impedances looking into transistor Q3 is non-zero prevents perfect PSSR (power supply rejection ratio) cancellation and also creates sensitivity to device mismatches between PMOS transistors M2 and M3 that is undesirable.

In particular, in the control loop formed by op-amp 12, the output voltage $V_{OUT}$ is fed back to the gate terminal of transistor M3 where transistor M3 acts as a common source inverting amplifier, thereby forming the primary negative feedback path. If there is anything that tends to change the currents at transistors M2 and M3 together, such as a change in the power supply voltage Vdd, there will be a change in the voltages at both the non-inverting and inverting input terminals (voltages Vin_p and Vin_n) of op-amp 12. Changes in the voltage Vin_n tend to subtract from the feedback signal at voltage Vin_p and in fact, perfect subtraction occurs but for the presence of resistor R0 at the non-inverting input terminal. The presence of resistor R0 reduces the negative feedback signal so that only a portion of the feedback signal appears at input voltage Vin_p of op-amp 12. This reduction in the feedback signal is undesirable.

Furthermore, when transistors M2 and M3 suffer from device mismatches due to fabrication process variations, such mismatches will disturb the ratio of their drain currents and will create a change in voltage $V_{BEH}$. The control loop of op-amp 12 will adjust the voltage at the non-inverting input terminal (node 14) to a point where the voltage Vin_p equals the changed voltage $V_{BEH}$. The PTAT current $I_{PTAT}$ flowing through resistor R0 is thus changed due to device mismatches.

The PTAT current sensitivity to device mismatches can be analyzed by introducing a voltage, denoted as voltage $V_{OS}$, between the gate terminals of transistor M2 and M3. A range of non-zero voltage offset values can be applied to voltage $V_{os}$ to simulate all processing non-uniformities which affect the matching between transistors M2 and M3. FIG. 3 illustrates the response of the reference current $I_{REF}$ for the conventional PTAT current source of FIG. 1 as the offset voltage $V_{OS}$ is varied from −5 mV to 5 mV. The top curve 52 of FIG. 3 illustrates the response of the reference current $I_{REF}$ in current source 10 of FIG. 1. The simulation result shows that a peak-to-peak current variation of up to 128 nA. Such large variations in the reference current $I_{REF}$, which translates into variations in the PTAT current $I_{PTAT}$, is highly undesirable.

A current source for generating a PTAT current that can overcome the disadvantages of the conventional current sources is desired.

SUMMARY OF THE INVENTION

According to one embodiment of the present invention, a current source for generating a current proportional to absolute temperature (PTAT) uses a split resistor architecture. The current source includes a first bipolar transistor having an emitter terminal connected to a first power supply voltage, a base terminal coupled to a first node, and a collector terminal coupled to a second node where the first bipolar transistor has a first emitter area, and a second bipolar transistor having an emitter terminal connected to the first power supply voltage, a base terminal and a collector terminal coupled to a third node where the second bipolar transistor has a second emitter area being A times the first emitter area.

The current source further includes a first resistor coupled between the first node and the second node where the first resistor has a resistance value indicative of the emitter resistance $r_e$ of the first or second bipolar transistor at a preselected temperature $T_0$ and a preselected collector current $I_C$ and a second resistor coupled between a fourth node and the third node where the second resistor has a resistance value satisfying the equation re*(lnA−1). The current source further includes a current mirror electrically coupled to a second power supply voltage where the current mirror has a first current output terminal coupled to the first node to provide a first current and a second current output terminal coupled to the fourth node to provide a second current, and an operational amplifier having an inverting input terminal coupled to the second node, a non-inverting input terminal coupled to the fourth node and an output terminal providing an output signal being coupled to control the current mirror. The second current provided at the second current output terminal of the current mirror and flowing through the second resistor is the current proportional to absolute temperature and the preslected collector current $I_C$ is equal to the second current.

According to another aspect of the present invention, an emitter area trim scheme is applied to the PTAT current source of the present invention employing a split resistor architecture or to conventional PTAT current sources using bipolar transistors of unequal areas to generate a PTAT current. Thus, in one embodiment, the trim scheme is implemented by including in the PTAT current source a set of bipolar transistors having gradually increasing emitter areas and being switchably connected in parallel with the second bipolar transistor in response to a set of programming signals. In operation, one or more of the set of programming signals are asserted to connect one or more of the set of bipolar transistors in parallel with the second bipolar transistor to modify the effective emitter area of the second bipolar transistor. The base terminals of at least the one or more connected bipolar transistors are connected to the respective collector terminals and to the collector terminal of the second transistor. The emitter terminals of at least the one or more connected bipolar transistors are connected to the first power supply voltage.

The present invention is better understood upon consideration of the detailed description below and the accompanying drawings.

BRIEF DESCRIPTION OF THE DRAWINGS

FIG. 5, which includes

FIG. 6, which includes

DETAILED DESCRIPTION OF THE PREFERRED EMBODIMENTS

Figure 1:
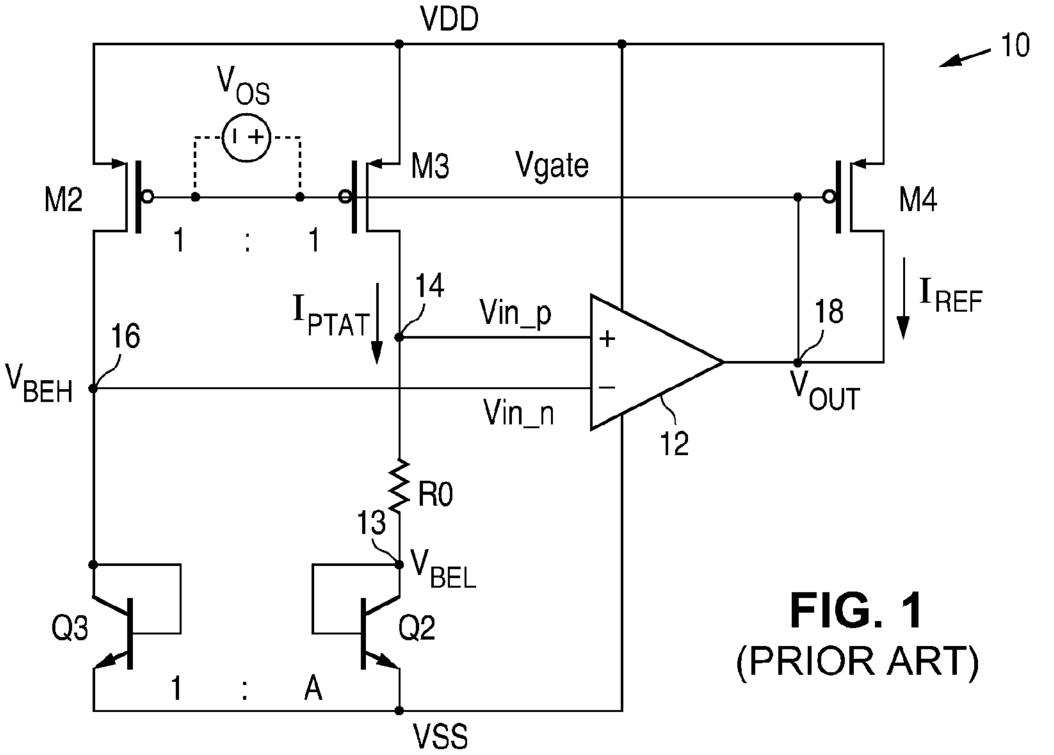
FIG. 1 (PRIOR ART)
FIG. 1 is a circuit diagram illustrating a conventional PTAT current source.

In accordance with the principles of the present invention, a current source for providing a current proportional to absolute temperature (a PTAT current) includes two bipolar transistors operating at unequal current densities to create a delta- $V_{BE}$ ($\Delta V_{BE}$) voltage which is intrinsically PTAT. In general, the $\Delta V_{BE}$ voltage is super-imposed across a resistor to produce a PTAT current. In accordance with the present invention, the current source implements a split resistor architecture where the current source includes a first resistor coupled to the unit area bipolar transistor and a second resistor coupled to the A-ratio-area bipolar transistor to form a zero gain amplifier. A voltage indicative of the $\Delta V_{BE}$ voltage is super-imposed across the first and the second resistors to provide the PTAT current. The first resistor has a resistance value indicative of the emitter resistance $r_e$ of the bipolar transistors while the second resistor has a resistance value satisfying the equation $r_e*(\ln A-1)$. The first and second resistors operate to significantly reduce output current inaccuracies due to mismatch errors in the current mirror devices supplying the bipolar transistors.

According to another aspect of the present invention, an emitter area trim scheme is applied to a PTAT current source to correct for current source inaccuracies due to fabrication process variations. In particular, the emitter area trim scheme of the present invention enables the simultaneous correction of fabrication process errors that arise from both resistor sheet resistance variations and the bipolar transistor area mismatches. In one embodiment, the emitter area trim scheme is applied to a PTAT current source includes two bipolar transistors having unequal emitter areas and thus operating at unequal current densities. The emitter area trim scheme utilizes an area-DAC (digital-to-analog converter) or ADAC which is programmed to modify the effective emitter area of the A-ratio-area bipolar transistor in the pair of bipolar transistors having 1:A emitter area ratio.

In another embodiment, the ADAC is applied to a PTAT current source of the present invention implementing the split resistor architecture. When trimming is applied to such a PTAT current source using the ADAC, the transconductance ($g_m$) at the intended operating point of the two bipolar transistors is not affected so that the zero gain amplifier aspect of the two split resistor embodiment preserves its effectiveness in canceling mismatch errors for any choice of target trim values and at any temperature.

Furthermore, according to another aspect of the present invention, when the emitter area trim scheme is applied in a PTAT current source to modify the effective emitter area of the A-ratio-area bipolar transistor, a compensation scheme is applied to the unit area bipolar transistor to reduce errors caused by the resistance introduced due to the coupling of the ADAC to the A-ratio-area bipolar transistor. Specifically, the compensation scheme includes a dummy transistor device or a dummy transistor array coupled to the unit area bipolar transistor where the dummy transistor device or array matches or duplicates the resistance introduced by the ADAC on the A-ratio-area bipolar transistor. The compensation technique substantially reduces the second order errors arising from the base contact resistance and spreading resistances and from the "on" resistances of the switches in the ADAC. These resistances create a voltage error when base current of bipolar transistors in the ADAC flows through them. The matching dummy transistor device or array operates to cancel out errors due to these resistances so that a highly accurate current output can be achieved.

Split Resistor Architecture

Figure 2:
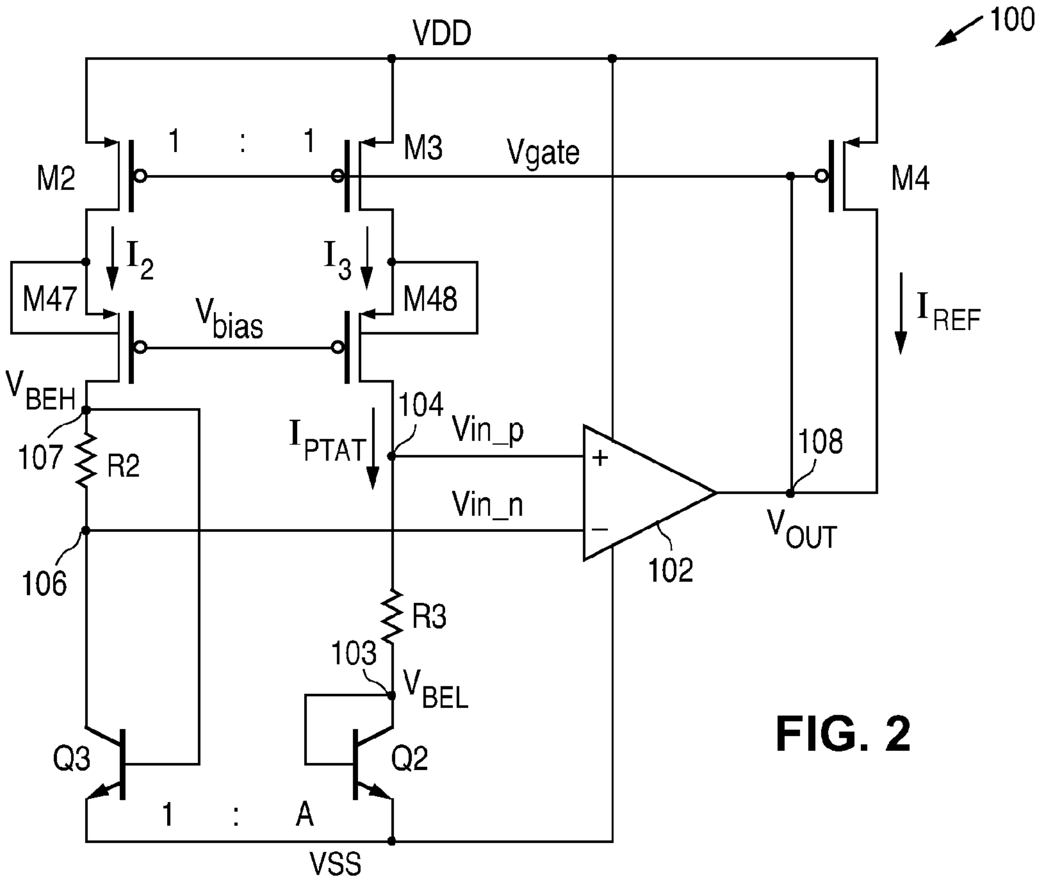
FIG. 2 is a circuit diagram illustrating a PTAT current source according to one embodiment of the present invention.

FIG. 2 is a circuit diagram illustrating a PTAT current source according to one embodiment of the present invention. In the present embodiment, a PTAT current source 100 utilizes a split resistor architecture for reducing current inaccuracies due to mismatch errors in devices forming the current source. Referring to FIG. 2, PTAT current source 100 includes NPN bipolar transistors Q2 and Q3 of unequal emitter area operating at unequal current densities to generate a voltage difference between the base-to-emitter voltages $V_{BE}$ of the two bipolar transistors. Specifically, bipolar transistor Q3 is a unit area transistor while bipolar transistor Q2 is an A-ratio-area transistor having an emitter area that is A times that of transistor Q3. The transistors Q3 to Q2 are said to have an area ratio of 1:A.

The emitter terminals of NPN bipolar transistors Q2 and Q3 are both connected to the negative power supply voltage, that is, the Vss or ground voltage. The base terminal of transistor Q3 is connected to its collector terminal through a resistor R2. The base terminal of transistor Q2 is connected to its collector terminal. As thus configured, transistor Q3 generates a $V_{BEH}$ voltage at node 107 while transistor Q2 generates a $V_{BEL}$ voltage at a node 103. The difference in the base-to-emitter voltages, given as $\Delta V_{BE}=V_{BEH}-V_{BEL}$, is intrinsically PTAT in nature. A substantially PTAT current can be generated by super-imposing the PTAT voltage $\Delta V_{BE}$ across a resistor with low or moderate, fixed temperature coefficient. In the present embodiment, the PTAT voltage $\Delta V_{BE}$ is super-imposed across resistor R2 and R3 to generate the PTAT current.

PTAT current source 100 further includes a current mirror for supplying currents to bipolar transistors Q2 and Q3. In the present embodiment, the current mirror is implemented as a PMOS cascode current mirror including PMOS transistors M2, M3, M47 and M48. PMOS transistor M2 and PMOS transistor M47 are connected in series between the positive power supply voltage VDD and node 107 for supplying a current to transistor Q3. PMOS transistor M3 and PMOS transistor M48 are connected in series between the positive power supply voltage VDD and node 104 for supplying a current to transistor Q2. Cascode devices M47 and M48 have their gate terminals coupled to receive a $V_{bias}$ voltage. Transistors M2 and M3 are equally sized PMOS transistors and are driven by a Vgate signal which is a feedback signal in the current source control loop. Transistors M2 and M3 are controlled by the Vgate signal to provide currents to bipolar transistors Q3 and Q2.

One of ordinary skill in the art would appreciate that transistors M47 and M48 are cascode devices included to improve the power supply rejection characteristics of current source 100. Transistors M47 and M48 may be omitted in other embodiments of the present invention and the drain terminals of transistors M2 and M3 can be connected directly to nodes 107 and 104, respectively, to supply current to bipolar transistors Q3 and Q2. The use of a cascode current mirror in current source 100 is illustrative only and is not intended to be limiting.

In PTAT current source 100, a split resistor architecture is implemented where, instead of using a single resistor at the A-ratio-area transistor Q2 as is the case in the conventional current source, two resistors are used with one resistor coupled to each of the pair of bipolar transistors. Thus, in the present embodiment, a resistor R2 is connected between the base terminal (node 107) and the collector terminal (node 106) of unit area bipolar transistor Q3 and a resistor R3 is connected between the current output node (node 104) of the current mirror and the base/collector terminal (node 103) of A-ratio-area transistor Q2. Resistors R2 and R3 have specific resistance values to enable the proper cancellation of mismatch errors in current source 100, as will be described in more detail below.

In operation, a voltage indicative of the PTAT voltage $\Delta V_{BE}$ is super-imposed across resistor R2 and R3 to produce a desired output current. The current flowing through resistor R3 is PTAT (denoted as $I_{PTAT}$) when the resistor R2 and R3 have a negligible TC (Temperature Coefficient). The exact temperature coefficient of resistor R2 and R3 is not critical to the practice of the current source of the present invention. While resistors with low or negligible TC is preferred for resistors R2 and R3 when a PTAT output current is desired, resistors having a constant TC can also be used as resistors R2 and R3 with the resulting output current having a current vs. temperature slope that is not exactly PTAT. Specifically, when resistor R3 has a constant TC, the resulting current will have a temperature coefficient having a proportionally factor somewhat less than (sub-PTAT) or greater than (super-PTAT) 100% relative to absolute temperature.

An operational amplifier (op-amp) 102 implements the feedback control loop in current source 100. The voltage at node 106, which equals the $V_{BEH}$ voltage (on node 107) decreased by the voltage across resistor R2, is coupled to the inverting input terminal as the input voltage Vin_n of op-amp 102. The voltage at node 104 is coupled to the non-inverting input terminal as the input voltage Vin_p of op-amp 102. Operational amplifier 102 generates an output voltage $V_{OUT}$ (node 108) that is coupled to drive the gate and drain terminals of a PMOS transistor M4. PMOS transistor M4 provides a reference current $I_{REF}$ which is absorbed by op-amp 102, assuming that op-amp 102 is a low output impedance amplifier.

Op-amp 102 generates output voltage $V_{OUT}$ having a voltage value to cause the voltage difference between voltages Vin_p and Vin_n to go to zero. The output voltage $V_{OUT}$ forms the control voltage Vgate which is fed back to drive transistors M2 and M3 of the current mirror to cause transistors M2 and M3 to provide a certain amount of drain currents. In this manner, the voltage at the top terminal (node 104) of resistor R3 is driven to a voltage value equaling to the voltage on node 106, which is the $V_{BEH}$ voltage decreased by the voltage across resistor R2. A voltage indicative of the $\Delta V_{BE}$ voltage is thus super-imposed on resistor R2 and R3. A current flowing through resistor R3 is thus a PTAT current $I_{PTAT}$. The operation of the split resistor architecture in current source 100 will be described in detail below.

Because the output voltage $V_{OUT}$ driving the gate terminal of transistor M4 is also coupled to drive the gate terminals of transistors M2 and M3, transistors M2, M3 and M4 have the same gate-to-source voltages and thus transistors M2, M3 and M4 provide the same drain current output. Therefore, the reference current $I_{REF}$ is equal to the PTAT current $I_{PTAT}$ generated at the drain terminal of transistor M3 and also equal to the current at the drain terminal of transistor M2. The drain currents from transistors M2 and M3 passes through respective transistors M47 and M48 to respective resistors R2 and R3. The ratio between reference current $I_{REF}$ and PTAT current $I_{PTAT}$ remains fixed over process and power supply voltage variations.

The resistance values for resistors R2 and R3 satisfy the equation: R2+R3=R0 where the resistance value R0 is defined by equation (3) above and repeated below:

$$R_0 = \frac{N_f KT \ln A}{qI_{REF}} = \frac{N_f KT}{qI_{REF}} * \ln A = r_e * \ln A. \quad \text{Eq. (3)}$$

The operation of op-amp 102 is to servo the voltages Vin_p and Vin_n at its input terminals to a null by generating an output voltage $V_{OUT}$ as the control voltage Vgate which operates to force the drain currents of transistors M2 and M3 to satisfy the condition:

$$V_{BEH} - I_2 * R_2 = V_{BEL} + I_3 * R_3 \quad \text{Eq. (4)}$$

where $I_2$ denotes the drain current from transistor M2 and $I_3$ denotes the drain current from transistor M3. As discussed above, control voltage Vgate forces transistors M2, M3 and M4 to the same gate-to-source voltage and thus the transistors provide the same drain currents. Thus, the drain currents of transistors M2, M3 and M4 satisfy the condition: $I_2 = I_3 = I_{REF}$ and equation (4) can be rewritten as:

$$V_{BEH} - I_{REF} * R2 = V_{BEL} + I_{REF} * R3 \quad \text{Eq. (4)}$$

By rearranging terms and substituting $V_{BEH} - V_{BEL} = \Delta V_{BE}$, equation (4) can be used to derive the reference current $I_{REF}$ as follows:

$$I_{REF} = \frac{\Delta V_{BE}}{R_2 + R_3} = \frac{\Delta V_{BE}}{R_0} = \frac{N_f KT \ln A}{qR_0}. \quad \text{Eq. (5)}$$

A comparison of equations (1) and (5) reveals that current source 100 generates the same PTAT current as the conventional current source of FIG. 1. That is, by using the split resistor architecture, the PTAT current generated by current source 100 has not changed from the conventional circuit. However, the resistance values for resistors R2 and R3 are advantageously selected to allow careful reduction and balancing of the impedance seen at the input terminals of op-amp 102.

Specifically, the resistance values for resistors R2 and R3 are selected as:

$$R_2 = r_e = \frac{N_f KT_0}{qI_C}, \text{ where } I_C = I_{REF} \text{ and} \quad \text{Eq. (6)}$$

$$R_3 = R_0 - R_2, \text{ where } R_0 = r_e * \ln A \quad \text{Eq. (7a)}$$

$$R_3 = r_e(\ln A - 1). \quad \text{Eq. (7b)}$$

By the above equations, the resistance value for resistor R2 is selected to be equal to the emitter resistance $r_e$ for a given bias condition. Specifically, the resistance value for resistor R2 is equal to the emitter resistance $r_e$ at a temperature of $T_0$ and a collector current of $I_C$ where the collector current $I_C$ is equal to the reference current $I_{REF}$. The temperature $T_0$ and the current value of current $I_{REF}$ are design parameters for the PTAT current source and desired values can be selected to define the desired emitter resistance value $r_e$ for resistor R2 and, accordingly, the resistance value for resistor R3.

When the resistance values for resistors R2 and R3 are chosen using the above equations, bipolar transistor Q3 operates as an inverter with a negative gain of approximately unity. The equivalent impedance seen at the inverting input terminal (106) of op-amp 102 is ($r_e$−R2) or about zero. When the effective impedance at the inverting input terminal (106) of op-amp 102 is near zero, device mismatch errors between transistors M2 and M3 in the current mirror will have no incremental effect on the voltage Vin_n at the inverting input terminal. Thus, by using a resistor R2 having a resistance value matching the emitter resistance $r_e$, a major contributor to the current source's operating point inaccuracies is eliminated.

In the conventional current source of FIG. 1, the effective impedance seen at the inverting input terminal (node 16) of op-amp is $r_e$ while the effective impedance seen at the non-inverting input terminal (node 14) is $r_e$*[1+lnA]. When the split resistor architecture is applied, current source 100 realizes a reduction in the impedance seen by op-amp 102 at both input terminals. Specifically, in current source 100 of the present invention, the effective impedance seen at the inverting input terminal (node 106) is nominally zero while the effective impedance seen at the non-inverting input terminal (node 104) is: $r_e+r_e[\ln A-1]$ or $r_e*\ln A$. Thus, it can be readily observed that the impedances at both input terminals of op-amp 102 have been reduced as compared to the conventional circuit. Current source 100 has zero impedance instead of an impedance of $r_e$ at the inverting input terminal while an impedance of $r_e*\ln A$ instead of an impedance of $r_e*[1+\ln A]$ at the non-inverting input terminal of op-amp 102.

In the present embodiment, resistors R2 and R3 are chosen to have a very low temperature coefficient (TC<75 ppm/° C.). Thus, the resulting PTAT currents flowing through resistors R2 and R3 are about 98.7% PTAT. Bipolar transistor Q3 together with resistor R2 in the current source core is called a "zero gain amplifier" because the amplifier's sensitivity to incremental changes in the current supplied to the circuit branch is suppressed by a large amount as compared to the conventional case where the circuit branch includes only a diode-connected bipolar transistor. In one embodiment, a 50× improvement is realized. The high degree of error cancellation realized by the zero gain amplifier of resistor R2 and transistor Q3 is maintained well over a large temperature range because, in equation (6) above, the ratio of the absolute temperature term in the numerator to the temperature dependent current in the denominator ($I_C$ or $I_{REF}$) remains nearly constant. This condition, in turn, maintains $r_e$ nearly constant with changes in temperature, preserving the desired result of ($r_e$−R2) being nearly equal to zero.

Figure 3:
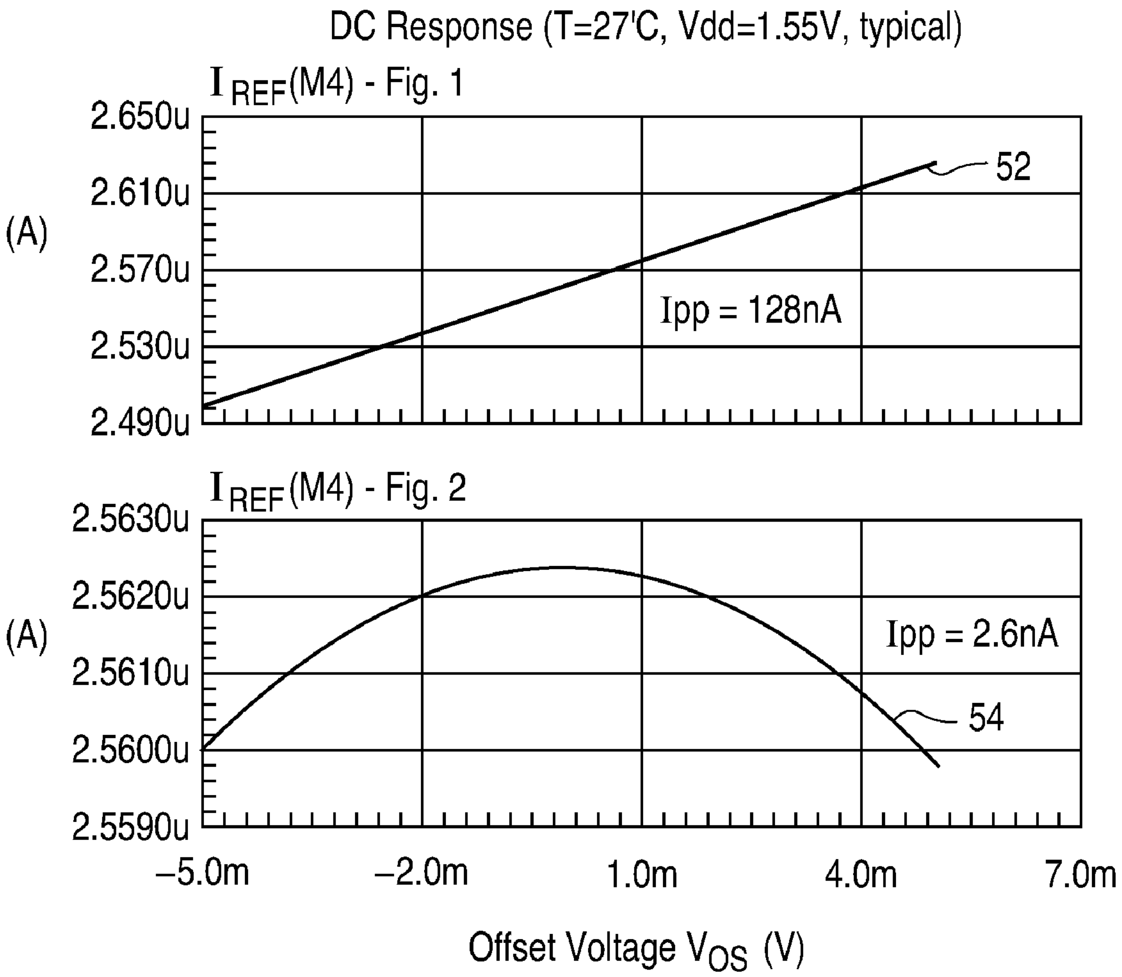
FIG. 3 illustrates the response of the reference current $I_{REF}$ for the conventional PTAT current source of FIG. 1 and the PTAT current source of the present invention in FIG. 2 as the offset voltage $V_{OS}$ is varied from −5 mV to 5 mV.

FIG. 3 illustrates the response of the reference current $I_{REF}$ for the conventional PTAT current source of FIG. 1 and the PTAT current source of the present invention in FIG. 2 as the offset voltage $V_{OS}$ is varied from −5 mV to 5 mV. The improvement provided by the PTAT current source 100 of the present invention can be readily observed from the simulation plots in FIG. 3 where an offset voltage is introduced between the gate terminals of transistors M2 and M3 in the PMOS current mirror to simulate mismatch errors between the two transistors. In the simulation plots of FIG. 3, the offset voltage $V_{OS}$ is varied about ±5.0 mV.

The top simulation plot (curve 52) illustrates the variation in the reference current $I_{REF}$ over variations of the offset voltage between transistors M2 and M3 in the conventional current source of FIG. 1. The simulation plot shows that a total variation in the reference current of about 128 nA from end to end of the offset voltage range is observed. The bottom simulation plot (curve 54) illustrates the variation in the reference current $I_{REF}$ over variations of the offset voltage between transistors M2 and M3 in current source 100 of FIG. 2 of the present invention. The simulation plot shows that the total variation in the reference current is only about 2.6 nA from peak to peak. The current variation range achieved by the current source of the present invention represents an approximately 50× reduction in sensitivity to offset voltage mismatch between the transistors in the PMOS current mirror as compared to the conventional PTAT current source.

Another characteristic of the PTAT current source of the present invention that can be observed from FIG. 3 is that the variation in the reference current due to offset voltages is centered about the zero volt offset. Thus, the PTAT current source of the present invention utilizing a split resistor architecture is capable of nearly perfect rejection of small perturbation around a zero voltage offset. When the offset voltage is larger, the matching of resistor R2 to the emitter resistance $r_e$ is disturbed because the resistance of resistor R2 is not a function of current as is the emitter resistance $r_e$.

Emitter Area Trim Scheme

According to another aspect of the present invention, an emitter area trim scheme is implemented in a PTAT current source to effectively compensate for both area mismatch errors and for sheet resistance variations in the PTAT current source. By applying the trim scheme to cancel out both types of fabrication process variation errors, a more accurate PTAT current source can be realized. Furthermore, the trim scheme can be implemented with minimal increase in circuit complexity and circuit area.

The trim scheme of the present invention is particularly applicable to the PTAT current source where a pair of unequal sized bipolar transistors, biased by an equal sized, unity ratioed current mirror, is used to generate a PTAT current. In one embodiment, the trim scheme of the present invention is implemented as an emitter area trim scheme where an area-DAC (digital-to-analog converter) or ADAC is used to modify the effective emitter area of the A-ratio-area bipolar transistor in the pair of bipolar transistors having 1:A emitter area ratio.

The emitter area trim scheme of the present invention can be applied to the conventional PTAT current source of FIG. 1 as well as the inventive PTAT current source of the present invention employing a split resistor architecture, such as that shown in FIG. 2. In the following description, the trim scheme of the present invention is described as being applied to the PTAT current source of FIG. 2 using a split resistor architecture. However, the description is illustrative only and is not intended to limit the use of the emitter area trim scheme of the present invention to the PTAT current source of FIG. 2 only. One of ordinary skill in the art would appreciate that the emitter area trim scheme of the present invention can be applied to other PTAT current source including a pair of unequal sized bipolar transistors.

Figure 4:
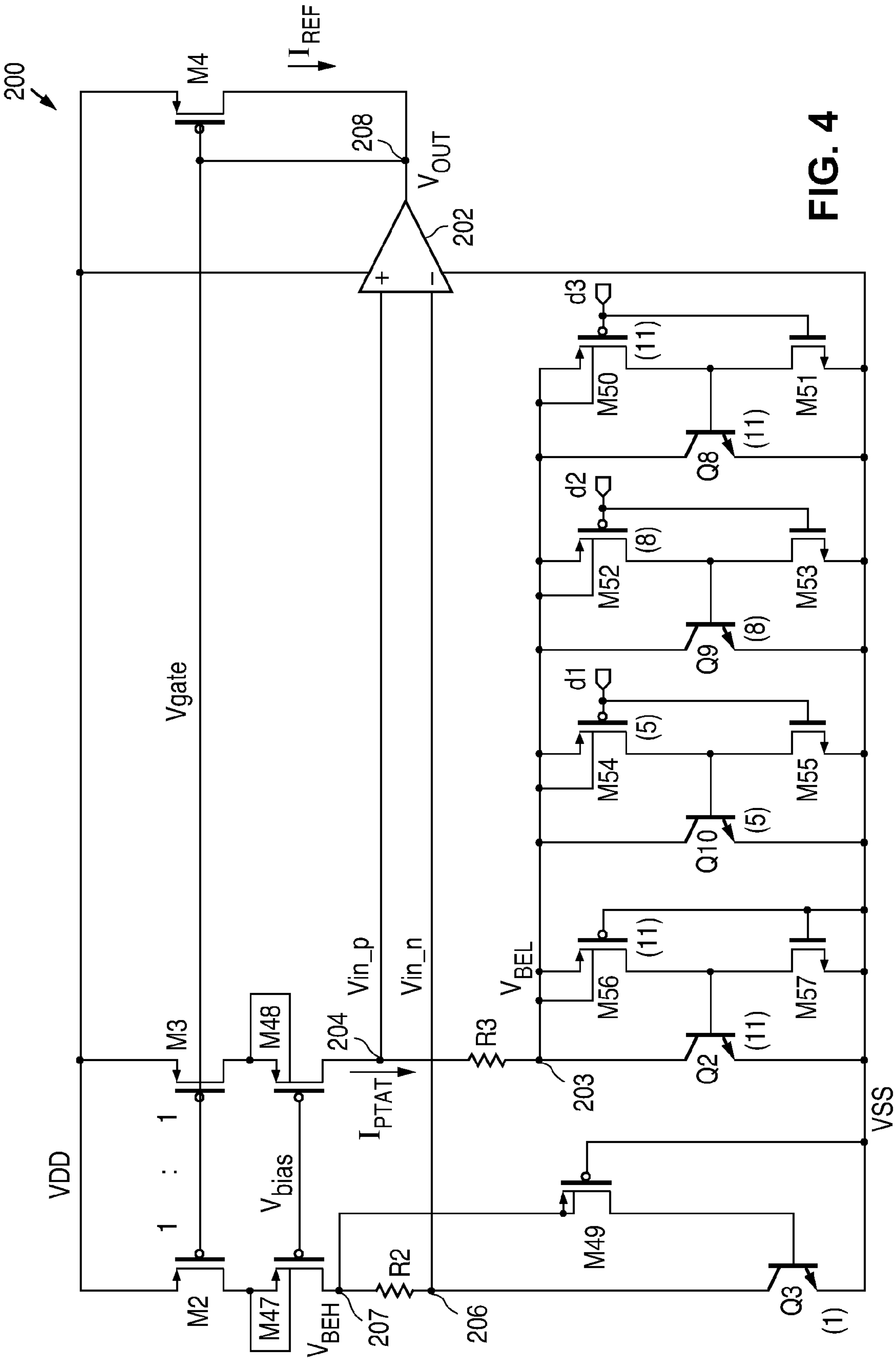
FIG. 4 is a circuit diagram of the PTAT current source of FIG. 2 incorporating the emitter area trim scheme according to one embodiment of the present invention.

FIG. 4 is a circuit diagram of the PTAT current source of FIG. 2 incorporating the emitter area trim scheme according to one embodiment of the present invention. The construction of the basic PTAT current source cell is the same as that of FIG. 2 and will not be further described. In the embodiment shown in FIG. 4, PTAT current source 200 includes a pair of unequal size NPN bipolar transistors Q3 and Q2 having a size ratio of 1:11. That is, the area ratio A is 11 in the present embodiment. The emitter area trim scheme is implemented by using a bank of NPN bipolar transistors Q8 to Q10, switchably coupled in parallel with the A-ratio-area bipolar transistor Q2, to modify the effective emitter area of transistor Q2.

The emitter area trim scheme of the present invention is effective in correcting for both the bipolar device area mismatch errors and the sheet resistance variation errors in a PTAT current source. Specifically, due to fabrication process variations, the pair of bipolar transistors may not have the ideal area ratio of 1:A due to mismatches in the emitter area of transistors Q2 and Q3. Furthermore, due to fabrication process variations, the sheet resistance of the resistors R2 and R3 will vary. These errors and variations introduce inaccuracies in the reference current generated by the PTAT current source. However, by inspection of equation (5) above and rewritten below, the reference current $I_{REF}$ is given as:

$$I_{REF}=\frac{N_f KT\ln A}{q(R_2+R_3)}. \qquad \text{Eq. (5)}$$

Thus, in order to compensate for errors in reference current $I_{REF}$, only the area ratio A needs to be adjusted and the area adjustment can account for both sources of DC errors discussed above (i.e. bipolar device mismatch and sheet resistance variation). In accordance with the present invention, an area DAC (digital-to-analog converter) is implemented in the PTAT current source to allow the emitter area ratio to be trimmed or fine tuned. In this manner, first order DC errors caused by bipolar device mismatch and sheet resistance variations can be effectively removed to greatly improve the accuracy and performance of the PTAT current source.

Referring to FIG. 4, bipolar transistors Q8, Q9 and Q10 form an area DAC controlled by digital input signals d1 to d3. One or more of bipolar transistors Q8 to Q10 are successively brought in to be connected in parallel with bipolar transistor Q2 by programming the trim code defined by signals d1 to d3. Bipolar transistors Q8 to Q10 are provided with different emitter areas to allow a variety of possible emitter areas to be obtained from the parallel combination of transistors Q2 and one or more of transistors Q8 to Q10. In the present embodiment, bipolar transistor Q2 has an emitter area of 11 units. Bipolar transistor Q8 has the same emitter area of 11 units while bipolar transistors Q9 and Q10 have successively decreasing emitter areas. Specifically, bipolar transistor Q9 has an emitter area of 8 units while bipolar transistor Q10 has an emitter area of 5 units.

By using the emitter areas in the ADAC as described above, with only transistor Q2 being selected and with each programming bipolar transistor being successively brought in, the following sequence of effective/modified emitter area A' for transistor Q2 can be obtained: 11, 16, 24 and 35. As the effective emitter area A' of transistor Q2 varies, the $\Delta V_{be}$ voltage between nodes 207 and 203 varies, at +25° C., in a sequence approximately equal to: 61.93 mV, 71.61 mV, 82.08 mV and 90.3 mV. Those skilled in the art will realize that other switching schemes to control independent transistors Q8, Q9, Q10 and Q2 would result in more choices for the effective emitter area A'. With the area values denoted above for these 4 transistors, 12 unique values for the effective emitter area A' are possible and up to 16 unique combinations are ultimately possible if the emitter area of Q8 is itself unique.

In the present embodiment, the ADAC formed by bipolar transistors Q8, Q9 and Q10 is switchably connected in parallel with bipolar transistor Q2 through a set of PMOS transistors M50, M52, and M54. A set of NMOS transistors M51, M53, and M55 are provided to disable the ADAC bipolar transistors when the transistors are not selected by the trim code. As thus constructed, a PMOS transistor and an NMOS transistor form an inverter receiving a programming signal. The output signal of each inverter formed by a pair of PMOS and NMOS transistors drives the base terminal of a respective bipolar transistor. For instance, PMOS transistor M50 and NMOS transistor M51 form an inverter to drive bipolar transistor Q8 having an emitter area of 11 units, PMOS transistor M52 and NMOS transistor M53 form an inverter to drive bipolar transistor Q9 having an emitter area of 8 units, and finally, PMOS transistor M54 and NMOS transistor M55 form an inverter to drive bipolar transistor Q10 having an emitter area of 5 units.

Each of bipolar transistors Q8 to Q10 has collector terminal connected to node 203 which is the collector terminal of transistor Q2 and has emitter terminal connected to the Vss or ground node where the emitter terminal of transistor Q2 is also connected. When a programming signal d1 to d3 is asserted (active low), the corresponding PMOS transistor is turned on and the corresponding NMOS transistor is turned off, the base terminal of the respective bipolar transistor Q8 to Q10 is then connected to node 203, activating the bipolar transistor and connecting the bipolar transistor in parallel with transistor Q2. When a programming signal d1 to d3 is deasserted (active high), the corresponding PMOS transistor is turned off and the corresponding NMOS transistor is turned on, the base terminal of the respective bipolar transistor Q8 to Q10 is thus grounded and the bipolar transistor is thus deactivated.

In the present embodiment, a dummy inverter formed by PMOS transistor M56 and NMOS transistor M57 is provided at bipolar transistor Q2. The input signal to the inverter is connected to the Vss voltage so that the PMOS transistor M56 is always turned on and the NMOS transistor M57 is always turned off. In this manner, bipolar transistor Q2 is permanently turned on with the base terminal being connected to the collector terminal through PMOS transistor M56. The provision of dummy inverter in current source 200 ensures symmetry between bipolar transistor Q2 and the programming bipolar transistors Q8 to Q10. When one or more of programming bipolar transistors Q8 to Q10 are brought in to modify the effective emitter area of transistor Q2, the base terminals of the connected programming bipolar transistors are connected to node 203 through their respective PMOS transistors. The base current of the programming bipolar transistor flowing through the associated PMOS transistor results in a voltage drop across the PMOS transistor due to the PMOS transistor's "on" resistance. Thus, in the ADAC, a voltage drop is present between the collector and base terminals of each connected programming bipolar transistor. To ensure symmetry, the dummy PMOS transistor M56 is coupled to bipolar transistor Q2 to ensure that the same voltage drop is seen across the base and collector terminals of transistor Q2.

Furthermore, in the present embodiment, the widths of PMOS transistors M50, M52, M54 and M56 are selected to be proportional to the emitter area of the associated bipolar transistors. That is, PMOS transistor M50, associated with bipolar transistor Q8 having an emitter area unit of 11, has a width of 11 units. PMOS transistor M52, associated with bipolar transistor Q9 having an emitter area unit of 8, has a width of 8 units. PMOS transistor M54, associated with bipolar transistor Q10 having an emitter area unit of 5, has a width of 5 units. Finally, PMOS transistor M56, associated with bipolar transistor Q2 having an emitter area unit of 11, has a width of 11 units. The use of proportionally sized PMOS transistors M50, M52, M54 and M56 has the effect of equalizing the voltage drop across the PMOS transistors so that the same voltage drop is seen by the bipolar transistors Q2 and Q8 to Q10. Specifically, because each bipolar transistors Q2 and Q8 to Q10 is unevenly sized, each transistor carries a different base current. By matching the width of the PMOS transistor to the emitter area of the associated bipolar transistor, the voltage drop across all of the PMOS transistors can be kept close to the same voltage value. For example, since bipolar transistor Q10 has a small emitter area, the base current for transistor Q10 is decreased. By flowing the smaller base current of transistor Q10 through PMOS transistor M54 having a smaller width, the same voltage drop is obtained across transistor M54 as in the other PMOS transistors.

An important advantage of the emitter area trim scheme of the present invention is that the trim scheme can be applied to correct for both bipolar transistor area mismatch errors and resistor sheet resistance variations at once without need to know the individual contribution of each error to the overall inaccuracy. Essentially, if there is a combination of errors from area mismatch between transistors Q2 and Q3 and from sheet resistance variations in the resistance of resistors R2 and R3, there will be some choice of the area DAC that will bring the output current $I_{REF}$ closest to the target value. This results in a precise PTAT current output is generated.

In other words, voltages $V_{BEH}$ and $V_{BEL}$ will be affected by effective area mismatches between all five NPN bipolar transistors (Q2, Q3, Q8 to Q10). But as far as the PTAT current source core is concerned, there will be one best choice out of all of the programming possibilities that will yield a reference current that is closest to an absolute target value. Thus, by selecting none or one or more of the programming bipolar transistors, the PTAT current output of current source 200 can be effectively trimmed.

In current source 200 of FIG. 4, the emitter area trim scheme is applied to a PTAT current source using a split resistor architecture for PMOS current mirror mismatch cancellation. An important characteristic of the split resistor architecture employed in the PTAT current source of FIGS. 2 and 4 is that the operation of the current mirror mismatch cancellation scheme using split resistors depends only on the matching of resistors R2 and R3 and matching of the $1/_{gm}$ of transistors Q2, Q3 to work. The current mirror mismatch cancellation scheme does not depend on the effective emitter area A' of the bipolar transistor Q2. This is because the $g_m$ of a bipolar transistor depends only on its collector current. Thus, the current mirror mismatch cancellation scheme using split resistors is trim area independent and furthermore, it is temperature independent. Therefore, the use of the area DAC in the PTAT current source 200 of FIG. 4 does not affect the operation of the current mirror mismatch cancellation scheme using split resistors.

The current mirror mismatch cancellation scheme using split resistors is temperature independent for the following reasons. The $1/g_m$ term of bipolar transistor Q2 or Q3 is given as:

$$1/g_m = \frac{N_f KT}{q(I_C(T))}, \quad \text{Eq. (8)}$$

where $I_C(T)$ is the collector current of the bipolar transistor and is normally constant over temperature. $1/g_m$ thus becomes PTAT (temperature dependent) because of the temperature T term in the numerator of equation (8). In actual operation, it is desirable that $1/g_m$ tracks the resistance of resistor R2 over temperature. Thus, by making the collector current $I_C(T)$ PTAT (temperature dependent), which naturally occurs in a PTAT current source bias cell, the term $[R(T)-1/g_m(T)]$ will nearly equal zero for all temperatures, thus maintaining the zero gain amplifier's ability to cancel PMOS current mirror device mismatch errors.

Thus, the emitter area trim scheme and the current mirror mismatch cancellation scheme can be applied to improve the accuracy of the PTAT current source. Once trimming is applied by selecting a value for the ADAC, there is no remaining temperature dependent error caused by the trimming. The temperature independent characteristics of the trim scheme represent a marked improvement over conventional trim schemes. The conventional trim schemes often have the result that the trimmed behavior is not guaranteed to be effective over all temperature range. Thus, when the conventional trim scheme is performed at one temperature, there is no guarantee that the accuracy of the trim result holds at other temperatures. However, the emitter area trim scheme of the present invention provides a trim result that is consistent over all temperatures. Thus, it is immaterial at which temperature the emitter area trim scheme is applied. When the best trim is applied at one temperature, the same accuracy of trim result will be guaranteed at other temperatures.

ADAC Compensation Scheme

In current source 200 of FIG. 4, when the ADAC is incorporated in the current source to implement emitter area trimming, the base terminal of transistor Q2, and that of any connected programming bipolar transistors, is connected to the collector terminal through a PMOS transistor. Because the base current of transistor Q2 is non-zero and the "on" resistance of PMOS transistor M56 is also non-zero, there is a finite voltage drop across PMOS transistor M56. This finite voltage drop between the collector and base terminals, if left uncorrected, introduces a voltage error in the $\Delta V_{BE}$ voltage of PTAT current source 200.

According to one aspect of the present invention, an ADAC compensation scheme is implemented in PTAT current source 200 which applies symmetry to cancel out the voltage error caused by the "on" resistance of the PMOS transistors in the ADAC. Basically, symmetry between bipolar transistors Q2 and Q3 is achieved by using one or more dummy PMOS transistors to introduce the same voltage drop between the collector terminal (node 207) and the base terminal of transistor Q3 so that transistors Q2 and Q3 experience the same collector-to-base voltage drop.

The cancellation of the voltage drop by using symmetry can be illustrated by inspecting the equation for the actual PTAT current generated by current source 200 which is given as follows:

$$I_{actual} = \frac{N_f \frac{KT}{q} \ln\left(A + \frac{\beta_3(\beta_2 - 1)}{\beta_2(\beta_3 - 1)}\right)}{R_0 + \left(\frac{r_{bb2} + R_{on2}}{1 + \beta_2} - \frac{r_{bb3} + R_{on3}}{1 + \beta_3}\right)} \quad \text{Eq. (9)}$$

where $\beta_2$, $\beta_3$ are the ratio of the collector current to base current of bipolar transistors Q2 and Q3; $rbb_2$, $rbb_3$ are base resistances of transistors Q2 and Q3; and $R_{on2}$, $R_{on3}$ are on-resistance of the PMOS transistors associated with transistors Q2 and Q3. As observed from equation (9) above, cancellation of the voltage drop due to the PMOS transistors used for emitter trimming can be realized by providing the same on-resistance at transistor Q3 to achieve symmetry.

In the embodiment shown in FIG. 4, the ADAC compensation scheme is implemented by adding a single PMOS transistor, such as PMOS transistor M49, between the collector terminal (node 207) and the base terminal of transistor Q3. PMOS transistor M49 has its control terminal connected to the Vss voltage so that the transistor is always on. Thus, PMOS transistor M49 is a dummy transistor and is added to the unit area transistor Q3 only for the purpose of compensating for the voltage drop error at the A-ratio-area transistor Q2. The width of M49 is selected in a way so as to compensate for the "on" resistance error due to any combinations of PMOS transistors M50, M52, M54 and M56 as transistor M56 alone or one or more of PMOS transistors M50, M52 and M54 can be turned on by the trimming process. In one embodiment, an optimum value for the size of PMOS transistor M49 is one where the "on" resistance of transistor M49 matches the geometric mean of the "on" resistance of all of the possible parallel combinations of PMOS transistors in the ADAC, including PMOS transistor M56. In the present embodiment, the width for transistor M49 is 20 units.

Figure 5A:
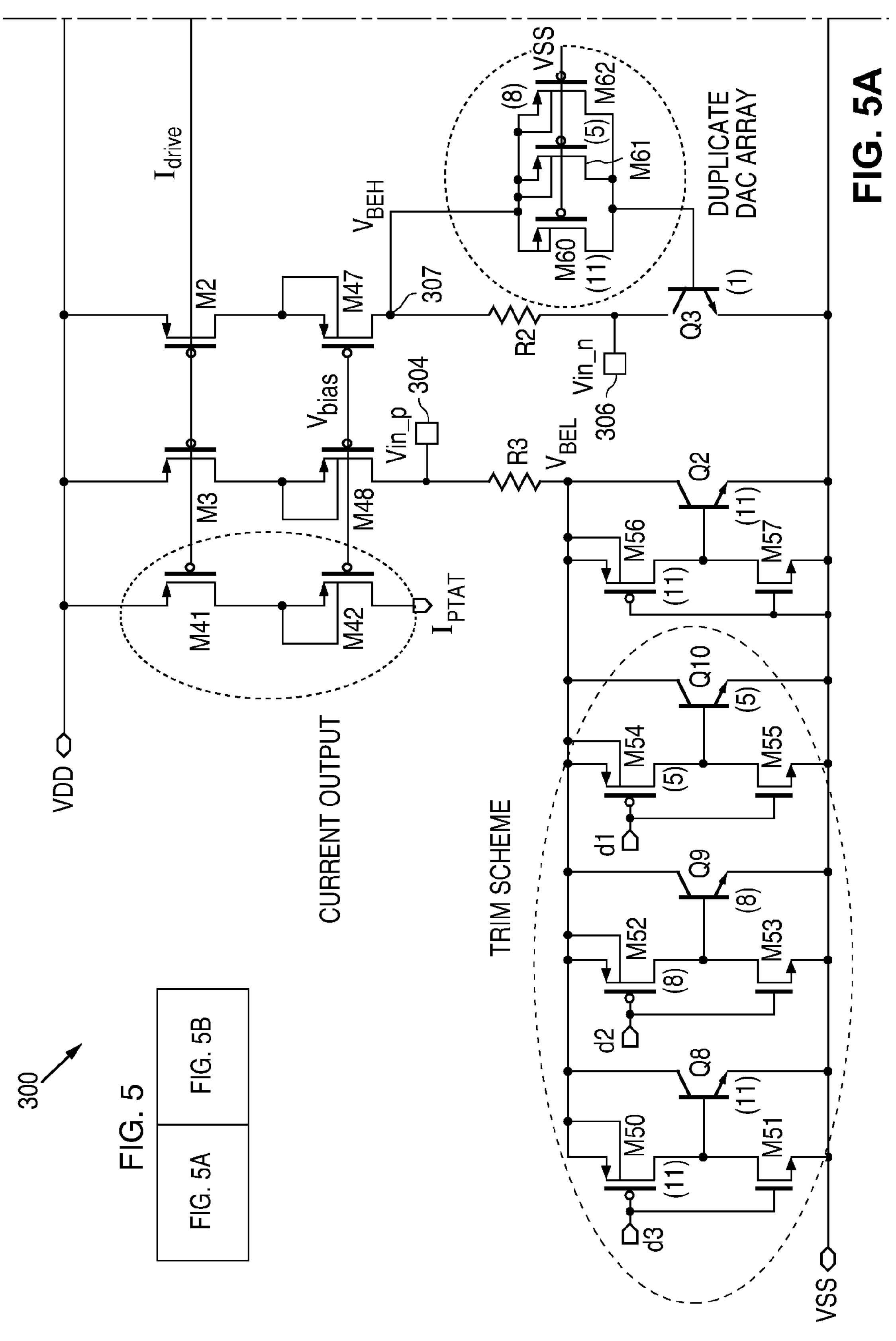
FIGS. 5A and 5B, is a detailed circuit diagram illustrating a PTAT current source according to a third embodiment of the present invention.
Figure 5B:
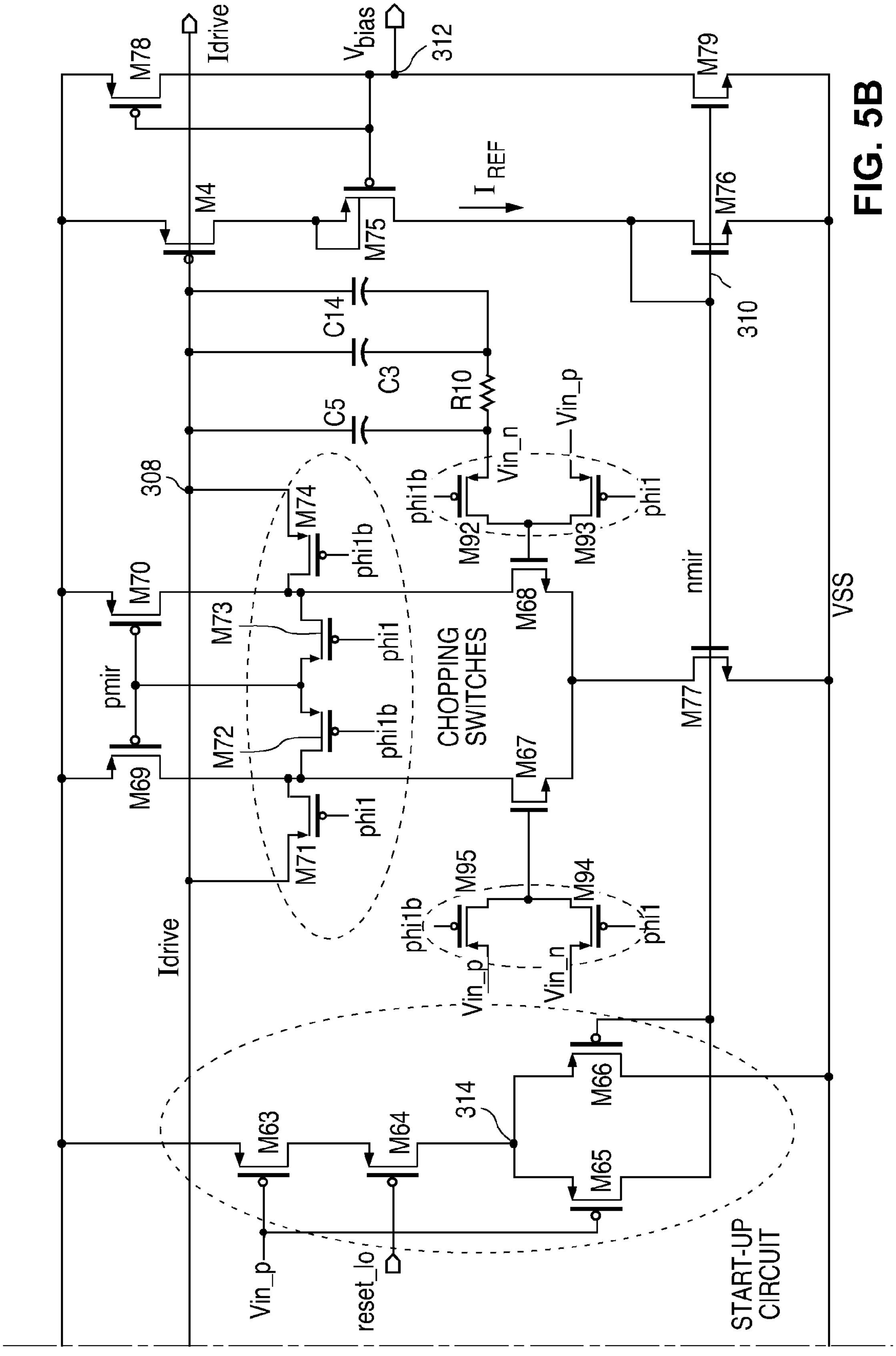
Figure 6A:
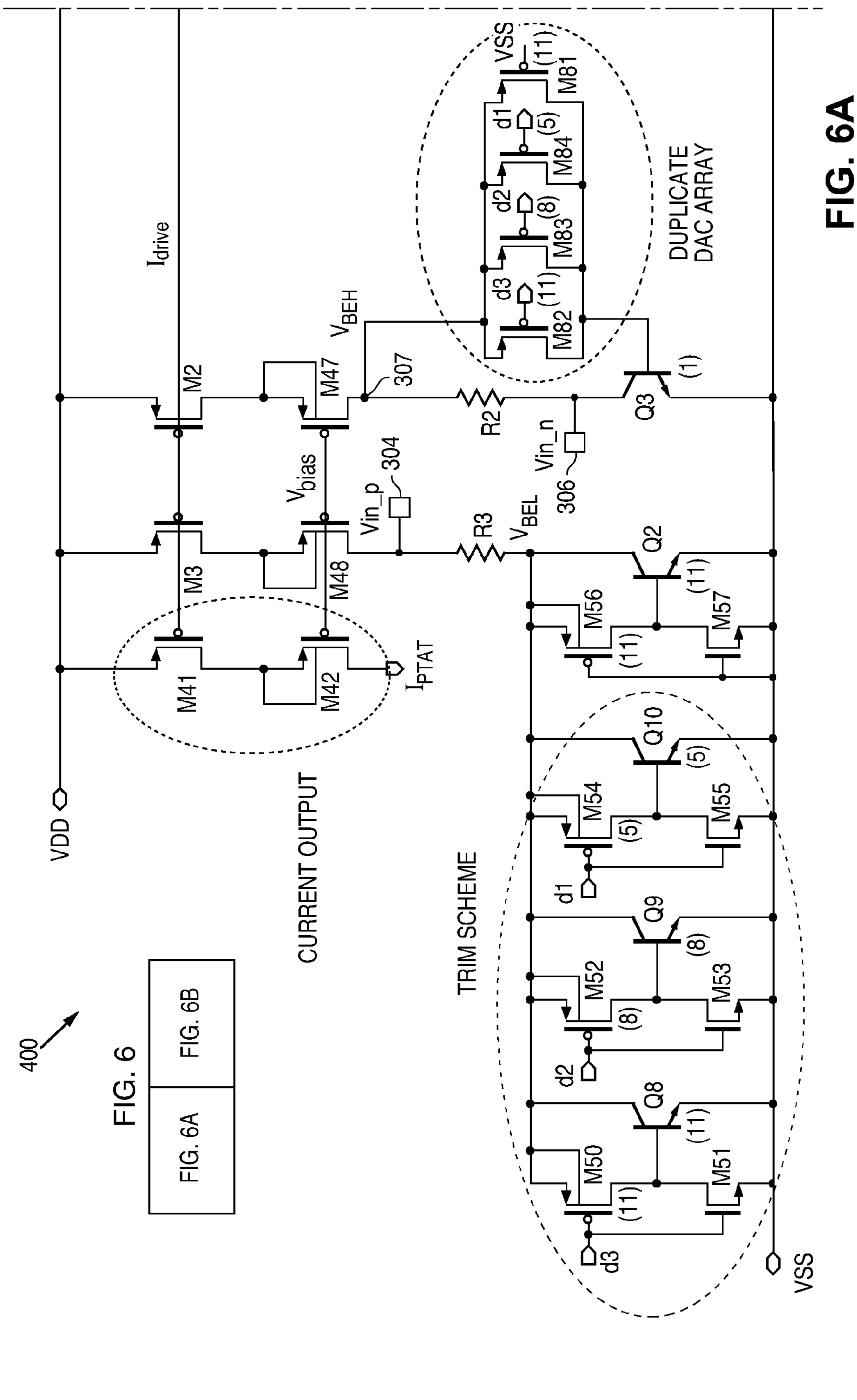
FIGS. 6A and 6B, is a detailed circuit diagram illustrating a PTAT current source according to a fourth embodiment of the present invention.
Figure 6B:
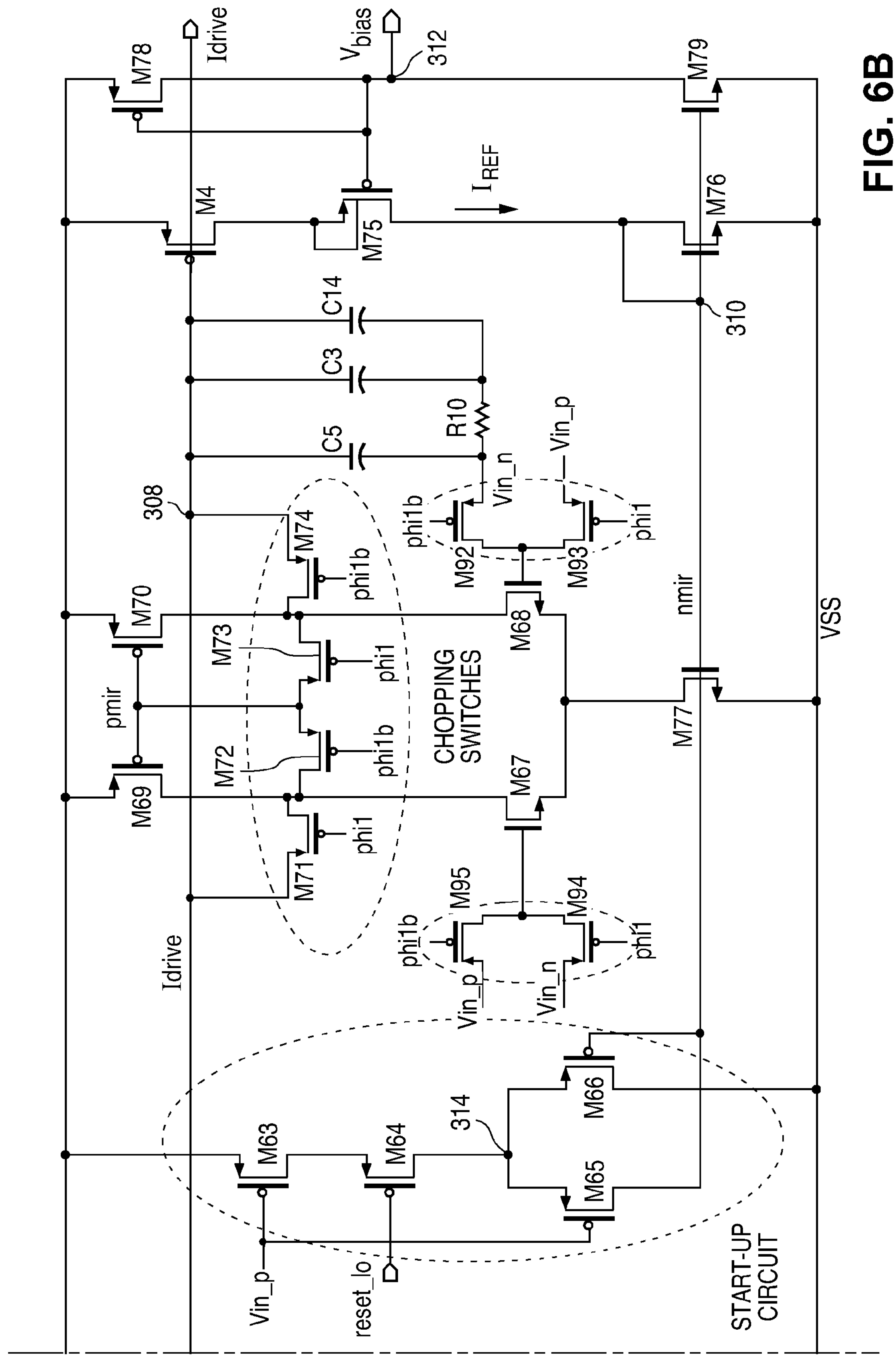

In another embodiment, instead of using a single dummy PMOS transistor having a specific size coupled to transistor Q3, a dummy transistor array can be used for the ADAC voltage drop compensation. FIG. 5, which includes FIGS. 5A and 5B, is a detailed circuit diagram illustrating a PTAT current source according to a third embodiment of the present invention. FIG. 6, which includes FIGS. 6A and 6B, is a detailed circuit diagram illustrating a PTAT current source according to a fourth embodiment of the present invention. FIGS. 5 and 6 illustrate implementation of the ADAC compensation scheme using a duplicate DAC array at the unit area bipolar transistor Q3. The duplicate DAC array can be a static array with all transistors being permanently turned on or the duplicate DAC array can be a dynamic array with each transistor in the duplicate DAC array being turned on in response to the programming signal. The dynamic duplicate DAC array perfectly matches the trim scheme DAC with perfect symmetry and error cancellation, while the static duplicate DAC array usefully approaches the same level of performance as a dynamic duplicate DAC array.

Referring to FIG. 5A, a duplicate DAC array including PMOS transistors M60, M61 and M62, connected in parallel, is coupled between the $V_{BEH}$ node (node 307) and the base terminal of bipolar transistor Q3. PMOS transistors M60, M61 and M62 have sizes matching the sizes of PMOS transistors M56, M54 and M52 in the ADAC. Thus, transistor M60 has a width of 11, transistor M61 has a width of 5 and transistor M62 has a width of 8, matching transistors M56, M54 and M52 respectively. PMOS transistors M60, M61 and M62 in the duplicate DAC array have their gate terminals connected to the Vss voltage so that they are always on. The duplicate DAC array of transistors M60, M61 and M62 is configured to duplicate the PMOS transistors in the ADAC that are turned on when the trim code is in the center of the trim range. That is, when the trim code d1 to d3 has a value of “001” which is in the center of the trim range, transistors M56, M54 and M52 in the ADAC coupled to bipolar transistor Q2 are turned on. The duplicate DAC array of transistors M60, M61 and M62 matches the three transistors that are turned on for the trim code “001”. By using the duplicate DAC array as shown in FIG. 5A, symmetry between transistors Q2 and Q3 is made as close as possible to eliminate voltage errors caused by the PMOS transistors in the ADAC.

Referring to FIG. 6A, a duplicate DAC array including PMOS transistors M81, M82, M83 and M84, connected in parallel, is coupled between the $V_{BEH}$ node (node 307) and the base terminal of bipolar transistor Q3. As in the case of the duplicate DAC array in FIG. 5A, PMOS transistors M81, M82, M83 and M84 have sizes matching the sizes of the PMOS transistors in the ADAC. Thus, transistor M81 has a width of 11, transistor M82 has a width of 11, transistor M83 has a width of 8 and transistor M84 has a width of 5, matching transistors M56, M50, M52 and M54 respectively. The duplicate DAC array of FIG. 6A is a dynamic array. PMOS transistor M81 duplicates M56 and has its gate terminal connected to the Vss voltage so that transistor M81 is always turned on as in the case of transistor M56. The gate terminals of PMOS transistors M82, M83 and M84 are connected to programming signals d3, d2 and d1, respectively. Thus, when a programming signal is asserted to select one of the programming bipolar transistors Q8 to Q10 in the ADAC, the corresponding one or more PMOS transistors in the duplicate DAC array are also turned on to introduce an on-resistance at the base terminal of transistor Q3 to realize perfect symmetry between transistors Q2 and Q3.

FIGS. 5 and 6 also illustrate the detail implementation of the operational amplifier in one embodiment of the PTAT current source of the present invention. The implementation of operational amplifier in FIGS. 5 and 6 is identical and thus the description below is made with reference to FIG. 5 only.

Referring to FIG. 5B which illustrates the op-amp circuitry in PTAT current source 300, all of the transistors in the op-amp operate at fixed ratios to the PTAT core current, which is very nearly supply voltage and process independent while being linearly dependent on temperature (PTAT). In a conventional PTAT current source, at least some of the transistors are biased from independent bias generating circuitry, mitigating the ability to have all drain currents and drain-to-source voltages of the operational amplifier to be highly symmetrical and thus reducing performance capability of the conventional PTAT current source.

To further enhance the performance of the PTAT current source of the present invention, the input topology of the differential amplifier of the op-amp input stage is designed with a high degree of symmetry so that nominally equal error sources are cancelled. The PTAT current $I_{REF}$ generated at the output of the op-amp is routed through transistors M76 to M77 to bias the tail current of the differential amplifier of the operational amplifier. In this manner, first order symmetry for all PMOS drain currents is achieved. The op-amp load cells (M4, M75, M76, M79 and M78) are both current mirrors. The current mirrors’ equal area construction combined with a topology where each PMOS drain voltage is terminated by an essentially equal, Vdd independent value, makes for extreme symmetry of operation in the operating points of all of the critical op-amp devices.

The operational amplifier in FIG. 5B includes a start-up circuit for properly biasing the op-amp during circuit start-up. PMOS transistors M65 and M66 in the start-up circuit are of different size and thus have different threshold voltages. In operation, PMOS transistors M65 and M66 form a differential pair for sensing the voltage difference between the $V_{BE}$ voltages and the gate-to-source voltage of transistor M77 providing the tail current to the differential amplifier. The width-to-length ratio of PMOS transistor M65 is made higher than that of PMOS transistor M66 in order to turn on PMOS transistor M65 first during the initial startup. A long channel PMOS transistor M63 provides the start-up current. When the $V_{BE}$ voltage is low and the op-amp has not started up, then the start-up circuit provides a start-up current through transistor M65 that flows into the diode connected NMOS transistor M76, which then controls the tail current of the differential pair and the bias voltage (Vbias) for the PMOS cascode current mirror. When the gate voltage at transistor M77 is very low, transistor M65 will direct all the current from transistors M63 and M64 to transistor M76. The current flow raises the voltage at drain terminal of transistor M75 so that current flows in M4 and M75.

Once the input voltage to the differential amplifier raises to a normal operating value, the start-up current is not steered into transistor M76 through transistor M65, but instead is steered through transistor M66 to ground so that the start-up current does not contribute a current error in normal operation.

In the present illustration, PMOS transistor M64 is controlled by a reset_lo signal which is turned off to cut off the start-up current when “reset_lo” goes high.

In the differential amplifier input stage of the operational amplifier, a highly symmetrical topology is used that allows for the maximum cancellation of like errors when the op-amp is biased as described above. The symmetrical topology is further enhanced by the application of well known chopping techniques to both the op-amp input transistors M67, M68 and the first stage current mirror transistors M69, M70. The chopping technique essentially eliminates op-amp offset voltage errors, further improving the performance of the PTAT current source.

Due to mismatches in the differential pair in the op-amp, the accuracy and stability of the reference current is adversely affected. The mismatch errors can arise from the NMOS input pair or the PMOS current mirror in the differential pair. The chopping scheme, implemented by transistors M71-74 and M92-95, operates to transpose the mismatched PMOS current mirror and the mismatched NMOS differential pair half of the time, thus canceling the effect of these mismatches at the system level.

In current source 300 of FIG. 5, the reference current $I_{REF}$ is provided at the drain terminal of PMOS transistor M75. The gate voltage "Idrive" of PMOS transistor M4 is the gate voltage driving the PMOS current mirror transistors M2, M3 of the PTAT current source core.

A key characteristic of the PTAT current source 300 of the present invention is a very high power supply rejection ratio (PSRR) over process variations and over the entire operating power supply voltage range. The high PSRR is achieved by the use of cascode devices M47 and M48 in the PMOS current mirrors and by ensuring that the termination voltages of all the current mirrors in the PTAT current source are nearly equal in magnitude wherever possible.

As described above, the PTAT current source 300 operates at a scaled replica of the basic PTAT reference current $I_{REF}$. Additional current outputs can be added simply by replicating the master reference cell (PMOS transistors M3, M48) and connecting current mirrors in parallel with the master reference cell. For example, in PTAT current source 300, PMOS transistors M41 and M42 are connected in parallel with transistors M3 and M48 to provide a PTAT current output $I_{PTAT}$.

By using one or more of the techniques described above, a PTAT current source achieving a high level of performance is realized while consuming minimal operating current and requiring little added complexity or area to implement.

The above detailed descriptions are provided to illustrate specific embodiments of the present invention and are not intended to be limiting. Numerous modifications and variations within the scope of the present invention are possible. The present invention is defined by the appended claims.

We claim:

1. A current source for generating a current proportional to absolute temperature (PTAT) comprising:

a first bipolar transistor having an emitter terminal connected to a first power supply voltage, a base terminal and a collector terminal coupled to a first node, the first bipolar transistor having a first emitter area;

a second bipolar transistor having an emitter terminal connected to the first power supply voltage, a base terminal and a collector terminal coupled to a second node, the second bipolar transistor having a second emitter area being A times the first emitter area;

a first resistor coupled between a third node and the second node;

a current mirror electrically coupled to a second power supply voltage, the current mirror having a first current output terminal coupled to the first node to provide a first current and a second current output terminal coupled to the third node to provide a second current;

an operational amplifier having an inverting input terminal coupled to the first node, a non-inverting input terminal coupled to the third node and an output terminal providing an output signal being coupled to control the current mirror, wherein the second current provided at the second current output terminal of the current mirror and flowing through the second resistor is the current proportional to absolute temperature; and a plurality of bipolar transistors having gradually increasing emitter areas and being switchably connected in parallel with the second bipolar transistor in response to a plurality of programming signals, wherein one or more of the plurality of programming signals are asserted to connect one or more of the plurality of bipolar transistors in parallel with the second bipolar transistor to modify the effective emitter area of the second bipolar transistor, the base terminals of at least the one or more connected bipolar transistors being connected to the respective collector terminals and to the collector terminal of the second transistor, the emitter terminals of at least the one or more connected bipolar transistors being connected to the first power supply voltage.

2. The current source of claim 1, wherein the first and second bipolar transistors and the plurality of bipolar transistors comprise NPN bipolar transistors.

3. The current source of claim 1, wherein each bipolar transistor of the plurality of bipolar transistors has a collector terminal coupled to the second node, an emitter terminal coupled to the first power supply voltage and a base terminal, the base terminal being switchably connected to one of the second node or the first power supply voltage in response to a respective programming signal, wherein the respective programming signal is asserted to connect the base terminal of the respective bipolar transistor to the second node, thereby connecting the bipolar transistor in parallel with the second bipolar transistor, and the respective programming signal is deasserted to connect the base terminal of the respective bipolar transistor to the first power supply voltage, thereby disabling the bipolar transistor.

4. The current source of claim 1, wherein the first and second bipolar transistor and the plurality of bipolar transistors comprise NPN bipolar transistors and the first power supply voltage comprises a Vss or ground voltage.

5. The current source of claim 1, further comprising a plurality of first transistors and a plurality of second transistors, wherein for each bipolar transistor of the plurality of bipolar transistors, the base terminal is coupled to the second node through a respective first transistor and to the first power supply voltage through a respective second transistor, the first transistor and the second transistor being of opposite polarity types and being controlled by the respective programming signal, and the plurality of first transistors having device sizes proportional to the emitter areas of the associated bipolar transistors.

6. The current source of claim 5, wherein the base terminal of the first bipolar transistor is connected to the first node through a third transistor having the same polarity type as the plurality of first transistors, the third transistor having a control terminal connected to the first power supply voltage, a first current handling terminal coupled to the base terminal of the first bipolar transistor and a second current handling terminal coupled to the first node, wherein the third transistor has an "on" resistance that matches the geometric mean of the on-resistance of all parallel combinations of the plurality of bipolar transistors with the second bipolar transistor.

7. The current source of claim 5, wherein the base terminal of the first bipolar transistor is connected to the first node through a plurality of third transistors having the same polarity type as the plurality of first transistors, the plurality of third transistors having control terminals connected to the first power supply voltage, first current handling terminals coupled to the base terminal of the first bipolar transistor and second current handling terminals coupled to the first node, wherein the plurality of third transistors have device sizes matching the device sizes of the plurality of first transistors.

8. The current source of claim 5, wherein the base terminal of the first bipolar transistor is connected to the first node through a plurality of third transistors having the same polarity type as the plurality of first transistors, the plurality of third transistors including a sixth transistor having a control terminal coupled to the first power supply voltage for turning on the sixth transistor and the remaining plurality of third transistors having control terminals being controlled by the plurality of programming signals, first current handling terminals coupled to the base terminal of the first bipolar transistor and second current handling terminals coupled to the first node, wherein the plurality of third transistors have device sizes matching the device sizes of the plurality of first transistors.

* * * * *